United States Patent
Conte et al.

(10) Patent No.: US 12,375,074 B2
(45) Date of Patent: Jul. 29, 2025

(54) COMPARATOR SYSTEMS AND METHODS

(71) Applicant: STMicroelectronics S.r.l., Agrate Brianza (IT)

(72) Inventors: Antonino Conte, Tremestieri Etneo (IT); Marco Ruta, San Gregorio di Catania (IT); Michelangelo Pisasale, Catania (IT); Agatino Massimo Maccarrone, Regalbuto (IT); Francesco Tomaiuolo, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/157,977

(22) Filed: Jan. 23, 2023

(65) Prior Publication Data
US 2023/0283271 A1   Sep. 7, 2023

(30) Foreign Application Priority Data

Jan. 31, 2022 (IT) .................. 102022000001553

(51) Int. Cl.
*H03K 5/24* (2006.01)
*H03K 3/03* (2006.01)

(52) U.S. Cl.
CPC ............. *H03K 5/24* (2013.01); *H03K 3/0315* (2013.01)

(58) Field of Classification Search
CPC ..... G01R 19/0038; H03K 5/24; H03K 3/0315
USPC ........................................................... 327/65
See application file for complete search history.

(56) References Cited

U.S. PATENT DOCUMENTS

| | | | | |
|---|---|---|---|---|
| 5,889,419 | A * | 3/1999 | Fischer ................ | H03K 5/2481 327/563 |
| 7,142,462 | B2 * | 11/2006 | Kim ..................... | G11C 7/1072 327/91 |
| 7,196,778 | B2 * | 3/2007 | Lin ......................... | G01S 7/285 356/5.03 |
| 2006/0119401 | A1 | 6/2006 | Kitagawa et al. | |
| 2007/0290712 | A1 * | 12/2007 | Gomez .............. | H03K 19/0175 326/30 |
| 2009/0303093 | A1 * | 12/2009 | Gribok .................. | H03M 1/002 341/141 |
| 2014/0169038 | A1 * | 6/2014 | Kamath ................... | H03D 3/00 363/16 |
| 2019/0377378 | A1 | 12/2019 | Gharibdoust | |

(Continued)

*Primary Examiner* — Quan Tra
(74) *Attorney, Agent, or Firm* — Slater Matsil, LLP (57) ABSTRACT

A system a ring oscillator configured to produce a set of clock signals having the same clock period and a mutual time delay between respective clock signal edges. Comparator circuits are coupled to first and second input nodes and produce a set of comparison signals according to a respective sequence of comparison phases. A set of synchronization circuits is coupled to the ring oscillator and to the plurality of comparator circuits. The synchronization circuits allot, to each one of the comparator circuits, respective time windows for communication over respective communication lines of the comparison signals. The respective time windows are synchronized based on the clock signals. A multiplexer couples the respective communication lines to an output line to sequentially enable each of the comparator circuits to sequentially output respective comparison signals over the output line for the respective time windows thereby forming a composite comparison signal evolving over time.

23 Claims, 9 Drawing Sheets

(56) References Cited

U.S. PATENT DOCUMENTS

2022/0173744 A1\* 6/2022 Lee ..................... H03K 5/2481
2022/0399880 A1 12/2022 Conte et al.

\* cited by examiner

COMPARATOR SYSTEMS AND METHODS

CROSS-REFERENCE TO RELATED APPLICATIONS

This application claims the benefit of Italian Application No. 102022000001553, filed on Jan. 31, 2022, which application is hereby incorporated herein by reference.

TECHNICAL FIELD

The description relates to comparator systems and methods.

BACKGROUND

Conventional comparator circuits are currently identified as belonging mainly to one of two categories, referred to as "static" and "dynamic" comparators.

Static comparators comprise a differential input stage, optionally coupled to an amplification stage (e.g., in applications where resolution is of some relevance). Static architecture provides a relatively simple implementation and can be operated in a continuous mode, that is, in the absence of clocking circuitry. At the same time, static architecture may have some drawbacks related to energy consumption and an inevitable trade-off between speed and accuracy.

Dynamic comparators are based on a latching scheme (e.g., via a positive feedback loop) that facilitate achieving relatively high speeds in performing comparisons (e.g., in the order of 300 ps, where 1 ps=1 picosecond=$10^{-12}$ s). As a drawback, dynamic comparators are more complex (e.g., due to the presence of clocking circuitry) and are limited to time-discrete operation, in sampling systems, for instance.

An improved solution is thus desirable in order to provide increased flexibility of use of comparator circuits to a variety of electronic devices (e.g., charge pump regulators, sensors, on/off LDO).

SUMMARY

One or more embodiments can be applied to voltage regulators such as, for instance, charge pump regulators and/or low-dropout (LDO) voltage regulators with ON/OFF control. One or more embodiments may relate to a corresponding method.

One or more embodiments can contribute in providing an improved solution and/or overcoming aforementioned drawbacks.

In a first embodiment, a system comprises a ring oscillator configured to produce a set of clock signals having a same clock period. Clock signals in the set of clock signals have a mutual time delay between respective clock signal edges. A first input node is configured to receive a first input signal. A second input node is configured to receive a second input signal. A plurality of comparator circuits are coupled to the first and second input nodes to receive the first input signal and the second input signal. Comparator circuits in the plurality of comparator circuits are configured to produce a set of comparison signals as a result of comparing the first and second input signals therebetween according to a respective sequence of comparison phases. The comparison signals in the set of comparison signals have a first value in response to the second input signal reaching the first input signal and a second value in response to the second input signal failing to reach the first input signal. A set of synchronization circuits are coupled to the ring oscillator and to the plurality of comparator circuits. The set of synchronization circuits configured to drive comparator circuits in the plurality of comparator circuits to perform the respective sequences of comparison phases in a timed relationship therebetween based on clock signals in the set of clock signals. The set of synchronization circuits is configured to allot to each one of the comparator circuits in the plurality of comparator circuits respective time windows for communication over respective communication lines of the comparison signals in the set of comparison signals. The respective time windows are synchronized therebetween based on the clock signals in the set of clock signals. A multiplexer is configured to couple respective communication lines of the comparator circuits in the plurality of comparator circuits to an output line and to sequentially enable each one of the comparator circuits in the plurality of comparator circuits to sequentially output respective comparison signals over the output line (OUT) for the respective allotted time windows. Respective comparison signals sequentially output over the output line form a composite comparison signal evolving over time.

One or more embodiments comprise an offset compensation stage coupled to a dynamic comparator.

One or more embodiments facilitate providing a comparator configured to operate in a continuous mode, at top speed and accuracy, with reduced energy consumption.

One or more embodiments present one or more of the following aspects:
improved performance in terms of speed in performing comparisons, e.g., compatible with the high speed of a dynamic comparator,
reduced switching time, e.g., about 250 ps,
limited energy consumption, e.g., about 10 μA (1 μA=1 microAmpere=10-6 A) when operating at the top comparison speed,
improved accuracy thanks to offset compensation,
possibility of continuous mode operation,
flexible use extended beyond clocked systems/devices.

One or more embodiments may be applied in a variety of electronic devices such as, for instance, micro-controllers, sensors, and/or high-speed analog-to-digital converters (briefly, A/D or ADC).

BRIEF DESCRIPTION OF THE DRAWINGS

One or more embodiments will now be described, by way of non-limiting example only, with reference to the annexed Figures, wherein.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular configurations, structures, or characteristics may be combined in any adequate way in one or more embodiments.

The headings/references used herein are provided merely for convenience and hence do not define the extent of protection or the scope of the embodiments.

Also, for the sake of simplicity and ease of explanation, a same reference symbol/designation may be used throughout this description to designate both a circuit node or line and a signal occurring at that node or line.

Throughout the figures annexed herein, like parts or elements are indicated with like references/numerals unless the context indicates otherwise, and for brevity a corresponding description will not be repeated for each and every figure.

Figure 1:
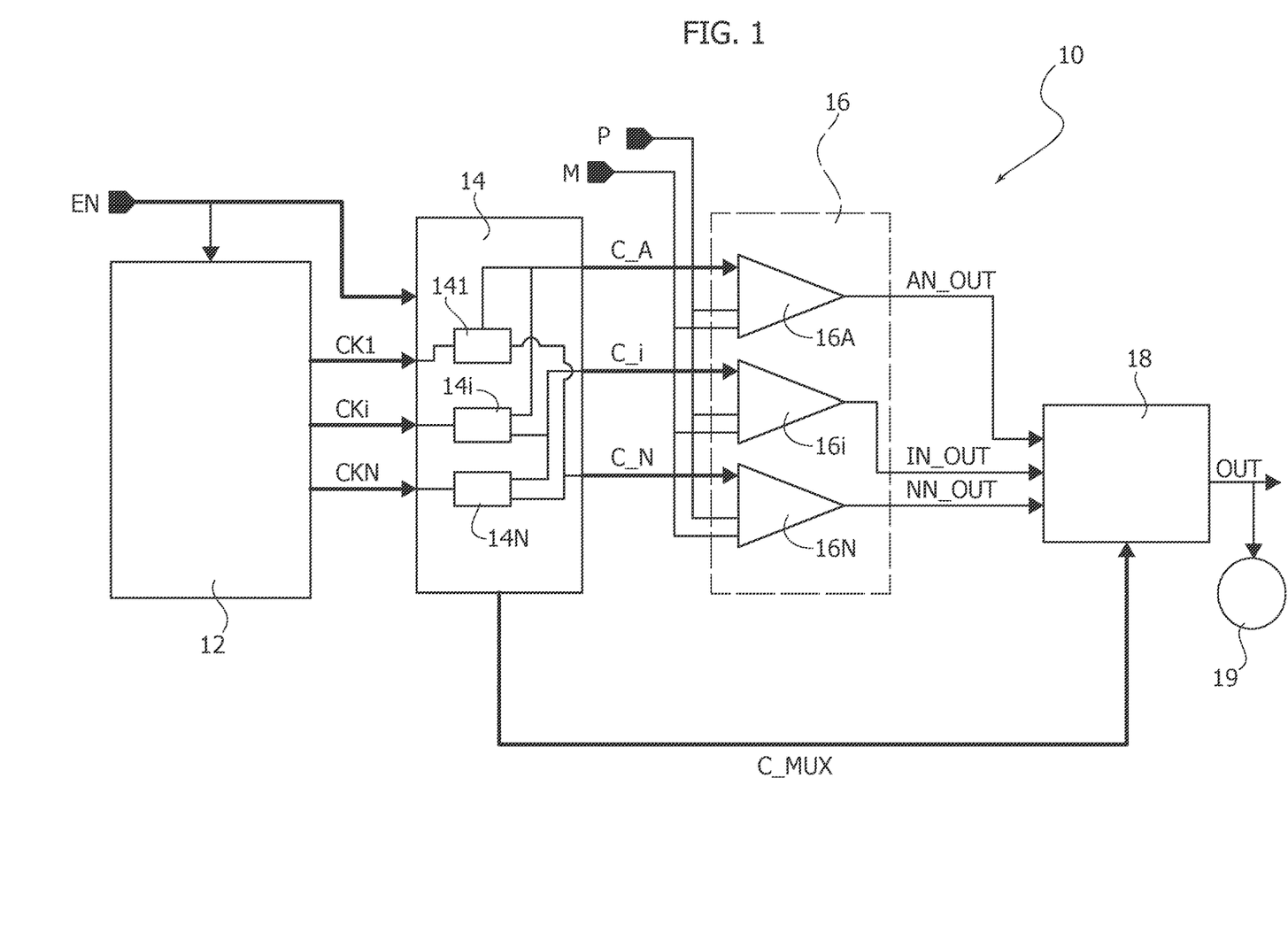
FIG. 1 is a diagram exemplary of a system as per the present disclosure.

As exemplified in FIG. 1, a comparator system (or device) 10 comprises a plurality of circuit blocks and nodes. For instance, the figure shows an enable node EN configured to produce an enable signal EN having a first value (e.g., "1" or "true") or a second value (e.g., "0" or "false"). At least some circuit blocks in the device 10 are configured to be triggered to become active in response to the enable signal EN having the first value.

A ring oscillator 12 (e.g., multi-stage ring oscillator) is configured to become active in response to the enable signal EN having the first value. The ring oscillator 12 is configured to produce a set of N clock signals CK1, CKi, CKN (such as a set of N=3 clock signals, for instance). Clock signals in the set of clock signals CK1, CKi, CKN have the same signal frequency (e.g., frequency 840 MHz, where 1 MHz=$10^6$ Hz=$10^6$ Hertz) and a mutual (time or phase) propagation delay a between an i-th clock signal CKi and the (i+1)-th clock signal CKN as well as with the (i−1)-th clock signal CK1. In one embodiment, the propagation delay σ is equal to a respective fraction 1/N (e.g., ⅓) of the period (that is, the inverse of the frequency) of clock signals in the set of clock signals CK1, CKi, CKN.

Synchronization circuitry 14 is coupled to the ring oscillator 12 and configured to receive the clock signals CK1, CKi, CKN. The synchronization circuitry 14 comprises a plurality of synchronization circuits 141, 14i, 14N. Synchronization circuits in the plurality of synchronization circuits 141, 14i, 14N are configured to produce respective sets of synchronization signals C_A C_i, C_N based on respective clock signals in the set of clock signals CK0, CKi, CKN, as discussed in the following.

A first input node P and a second input node M are configured to receive input signals to be compared therebetween.

Comparator circuitry 16 is coupled to the first M and second P input signals and to the synchronization circuitry 14. The comparator circuitry 16 comprises a plurality of (e.g., dynamic) comparator circuits 16A, 16i, 16N. Each comparator is configured to perform a comparison of the input signals P, M, based on the respective set of synchronization signals C_A C_i, C_N, producing as a result a respective comparison signal AN_OUT, IN_OUT, NN_OUT, as discussed in the following.

Multiplexer circuit (briefly, MUX) 18 is coupled to the comparator circuitry 16 and configured to receive the comparison signals AN_OUT, IN_OUT, NN_OUT, output by the respective comparison circuits 16A, 16i, 16N. The MUX circuit 18 is further coupled to the synchronization circuitry 14 to receive MUX control signals C_MUX. The MUX circuit 18 is configured to sequentially select a comparison signal in the set of comparison signals AN_OUT, IN_OUT, NN_OUT, output by the comparator circuitry 16. The MUX circuit 18 is configured provide the selected output signal OUT to a user circuit 19, such as a microcontroller circuit 19, for instance.

In the following, principles underlying one or more embodiments are discussed mainly with reference to a device 10 where the plurality of comparator circuits 16A, 16i, 16N, comprises a number N=3 comparator circuits and where the ring oscillator 12 produces a respective number of N=3 clock signals CK0, CKi, CK2, as exemplified in FIG. 1. It is noted that such a number of components is purely exemplary and in no way limiting. One or more embodiments may comprise notionally any odd number of components, for instance increased (e.g., five or more) with respect to the exemplary number of components exemplified in FIG. 1.

Figure 2:
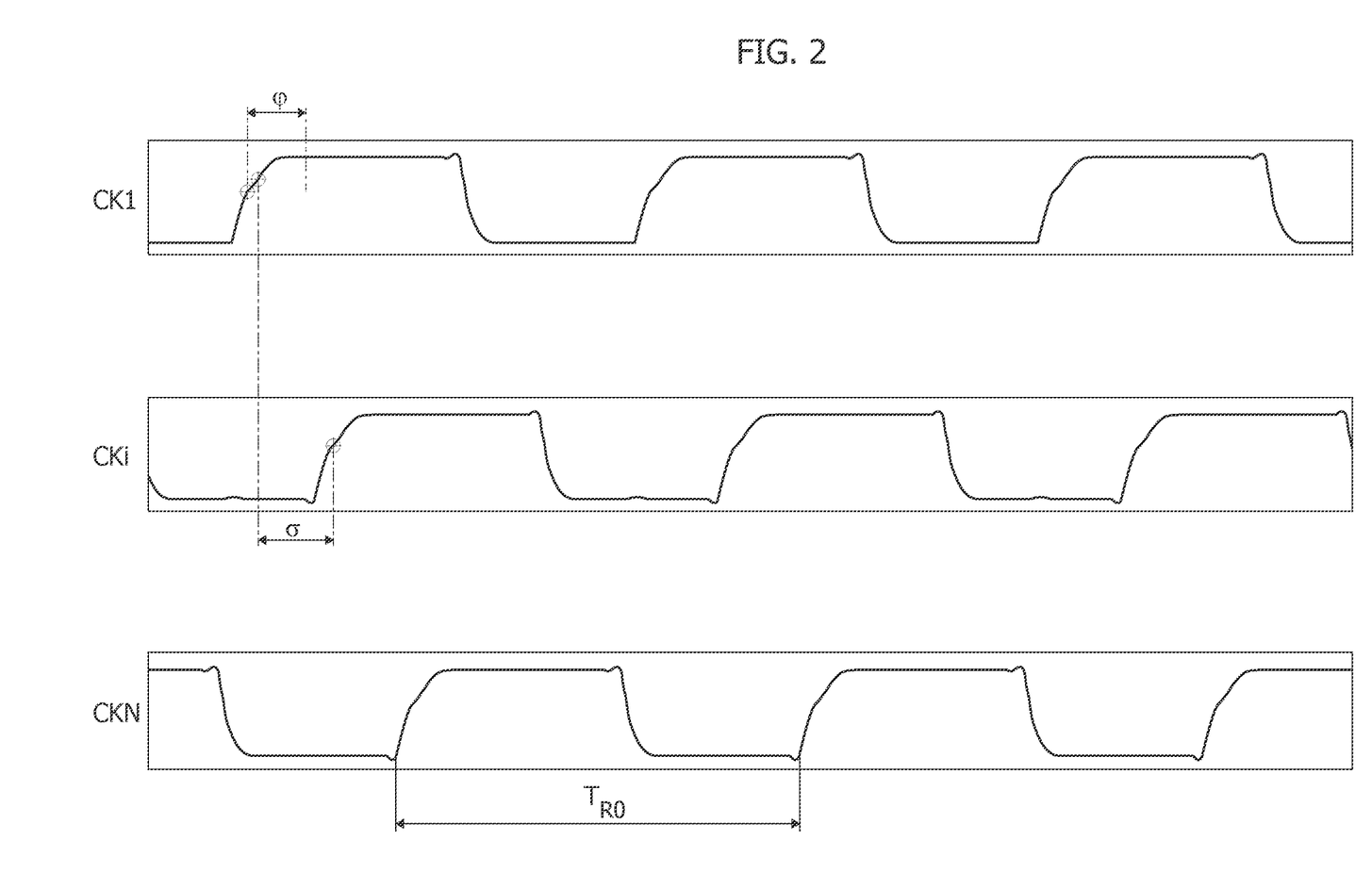
FIG. 2 is a time diagram of exemplary signals in one or more embodiments as per the present disclosure.

As exemplified in FIG. 2, the set of clock signals CKi, CKi, CKN, comprises a first clock signal CKi, a second clock signal CKi, a third clock signal CKN that can be produced via the ring oscillator 12, for instance by combining clock phases and delays through logic ports, in a manner per se known.

As exemplified in FIG. 2, with respect to a reference clock signal CKi as a reference signal, for instance, the second clock signal CKi has a respective first (e.g., rising) edge delayed by the propagation delay a with respect to the respective first (e.g., rising) edge of the first signal CKi. The third clock signal CKN has a respective first (e.g., rising) edge delayed by a propagation delay σ with respect to the respective first (e.g., rising) edge of the first clock signal CKi and by twice the propagation delay σ with respect to the reference signal CKi.

In a scenario where virtually any number N of clock signals are present, taking the first clock signal CK1 as reference signal, each i-th clock signal has its respective first edge delayed by a time interval that is an i-th multiple of the propagation delay G.

As exemplified in FIG. 2, the propagation delay σ is equal to a N-th fraction of the period of the reference clock signal CK1, e.g., ⅓ of the period of the first clock signal CK1 when N=3.

One or more embodiments may employ a ring oscillator as discussed in Italian Patent Application 102021000015647 by STMicroelectronics. U.S. Patent Pub. No. 2022/0399880 claims the benefit of the Italian patent and is incorporated herein by reference.

For instance, the ring oscillator circuit 12 comprises a chain of cascade-coupled inverter stages coupled between an oscillator supply voltage node and a reference voltage node. The oscillator supply voltage node is configured to provide an oscillator supply voltage. A current generator circuit is coupled between the oscillator supply voltage node and a system supply voltage node is configured to provide a system supply voltage. The current generator circuit is configured to inject a current into the oscillator supply voltage node. Each inverter stage comprises a first low-side transistor and a second low-side transistor coupled in series between the reference voltage node and an output node of the respective inverter stage.

A first high-side transistor is coupled between the oscillator supply voltage node and the output node of the respective inverter stage. The first low-side transistor and the first high-side transistor of each inverter stage have respective control terminals coupled to an input node of the respective inverter stage to receive therefrom a respective inverter control signal. The second low-side transistor of each inverter stage has a control terminal coupled to the oscillator supply voltage node to receive the oscillator supply voltage.

The ring oscillator circuit further comprises a biasing circuit including a first bias control transistor and a second bias control transistor coupled in series between the reference voltage node and the oscillator supply voltage node. The first bias control transistor has a control terminal configured to receive an oscillator control signal indicative of whether the ring oscillator circuit is in an active operation state or in an inactive operation state. The second bias control transistor has a control terminal coupled to the oscillator supply voltage node to receive the oscillator supply voltage. The first bias control transistor is configured to selectively couple the reference voltage node and the oscillator supply voltage node in response to the oscillator control signal being indicative of the ring oscillator circuit being in an inactive operation state.

A system as exemplified herein comprises, for instance, a ring oscillator 12 configured to produce a set of clock signals CK1, CKi, CKN having a same clock period $T_{RO}$, where clock signals in the set of clock signals have a mutual time delay σ between respective clock signal edges. A first input node P is configured to receive a first input signal P and a second input node M is configured to receive a second input signal M. A plurality of comparator circuits 16 are coupled to the first and second input nodes to receive the first input signal and the second input signal. Comparator circuits 16A, 16i, 16N in the plurality of comparator circuits are configured to produce a set of comparison signals AN_OUT, IN_OUT, NN_OUT as a result of comparing the first and second input signals therebetween according to a respective sequence of comparison phases K0, K1, K2, K3, K4. The comparison signals in the set of comparison signals have a first value in response to the second input signal reaching the first input signal and a second value in response to the second input signal failing to reach the first input signal.

A set of synchronization circuits 14 is coupled to the ring oscillator and to the plurality of comparator circuits. The set of synchronization circuits is configured to drive comparator circuits in the plurality of comparator circuits to perform the respective sequences of comparison phases in a timed relationship therebetween based on clock signals in the set of clock signals. The set of synchronization circuits is configured to allot to each one of the comparator circuits in the plurality of comparator circuits respective time windows K3, K4; Δ' for communication over respective communication lines AN_OUT, IN_OUT, NN_OUT of the comparison signals in the set of comparison signals. The respective time windows are synchronized therebetween based on the clock signals in the set of clock signals.

A multiplexer 18 is configured to couple respective communication lines of the comparator circuits in the plurality of comparator circuits to an output line OUT and to sequentially enable C_MUX, 183 each one of the comparator circuits in the plurality of comparator circuits to sequentially output respective comparison signals over the output line OUT for the respective allotted time windows K3, K4; Δ'. Respective comparison signals AN_OUT, IN_OUT, NN_OUT sequentially output over the output line OUT; LSIN form a composite comparison signal LSIN evolving over time.

As exemplified herein, the ring oscillator is configured to produce the set of clock signals comprising an integer number N of clock signals (i.e., N is a real number).

As exemplified herein, the plurality of comparator circuits comprises a number of comparator circuits equal to the integer number N of clock signals and the mutual time delay u between clock signals in the set of clock signals is equal to a fraction 1/N of the clock period of the clock signals in the set of clock signals.

Figure 3:
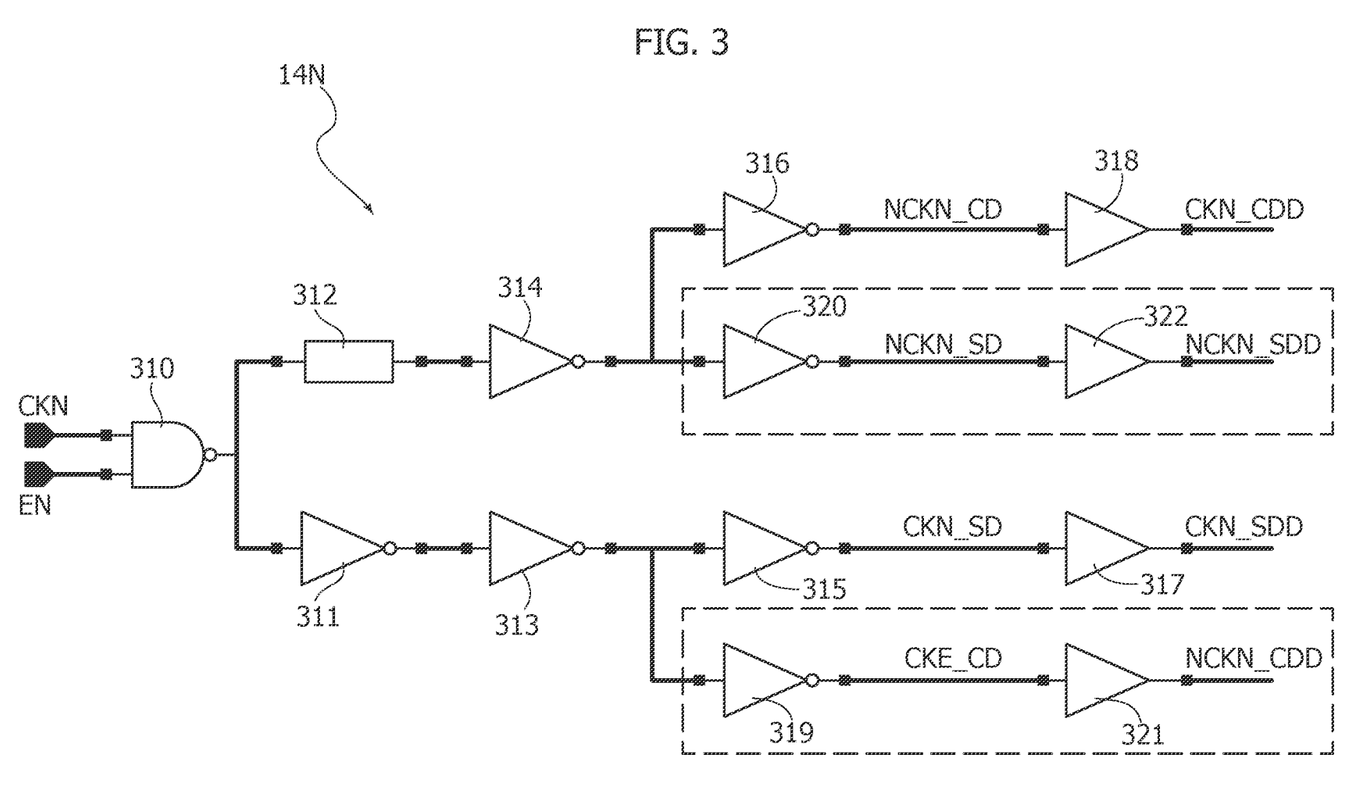
FIGS. 3 and 4 are diagrams exemplary of portions of FIG. 1.

As exemplified in FIG. 3, each synchronization circuit (e.g., the third one 16N) in the plurality of synchronization circuits 141, 14i, 14N in the synchronization circuitry 14 comprises a first input port (e.g., CKN) configured to receive a (e.g., third) clock signal CKN in the set of clock signals CK1, CKi, CKN and a second input port EN configured to receive the enable signal EN. An activation logic 310, e.g., a NAND gate, is configured to receive the clock signal CKN and the enable signal EN. A first data path 312, 314, 316, 318 is configured to produce a first synchronization signal (e.g., NCKN_CD) and a second synchronization signal (e.g., CKN_CDD) for the comparison circuit (e.g., 16N), as discussed in the following. A second data path 311, 313, 315, 317 is configured to produce a third synchronization signal (e.g., CKN_SDD) for the comparison circuit (e.g., 16N), as discussed in the following.

As exemplified in FIG. 3, the first data path 312, 314, 316, 318 comprise a delay line 312 coupled to the activation logic 310. A sequence of inverters 314, 316, 318 comprises i) a first inverter 314 coupled to the delay line 312, ii) a second inverter 316 coupled to the first inverter 314, the second inverter 316 providing as an output the first synchronization signal NCKN_CD, and iii) a third inverter 318 coupled to the second inverter 316, the third inverter 318 providing as an output the second synchronization signal NCKN_CDD.

As exemplified in FIG. 3, the second data path 311, 313, 315, 317 comprises a respective sequence of inverter circuits. For instance, a respective first inverter 311 is coupled to the delay line 312 and configured to emulate the (time) delay introduced therewith. A respective second inverter 313 is coupled to the respective first inverter 311. A third inverter 315 is coupled to the respective second inverter 313 and is configured to provide as an output a respective synchronization signal CKN_SD. A fourth inverter 317 is coupled to the third inverter 315 and provides as an output the third synchronization signal CKN_SDD.

As exemplified in FIG. 3, optionally, each synchronization circuit 14N comprises a data path branch 320, 322 of the first data path 312, 314, 316, 318. The first data path branch 320, 322 comprises a first branch inverter 320 and a second branch inverter 322. The first branch inverter 320 is coupled to the first inverter 314 in the first data path and produces a first complementary signal (e.g., NCKN_SD) as the negated version of the signal (e.g., CKN_SD) output by the third inverter 315 of the second data path 311, 313, 315, 317. The second branch inverter 322 is coupled to the first branch inverter 320 and produces a complementary synchronization signal (e.g., NCKN_SDD) as a negated version of the third synchronization signal (e.g., CKN_SDD).

As exemplified in FIG. 3, optionally, each synchronization circuit 14N further comprises a further data path branch 319, 321 of the second data path 311, 313, 315, 317. The further data path branch 319, 321 comprises a first further branch inverter 319 and a second further branch inverter 321. The first further branch inverter 319 is coupled to the second inverter 313 and produces a first complementary synchronization signal (e.g., CKN_CD) as a negated version of the first synchronization signal (e.g., CKN_CD). The second further branch inverter 321 is coupled to the first further branch inverter 319 and produces a complementary synchronization signal (e.g., NCKN_CDD) as a negated version of the second synchronization signal (e.g., CKN_SDD).

Figure 6:
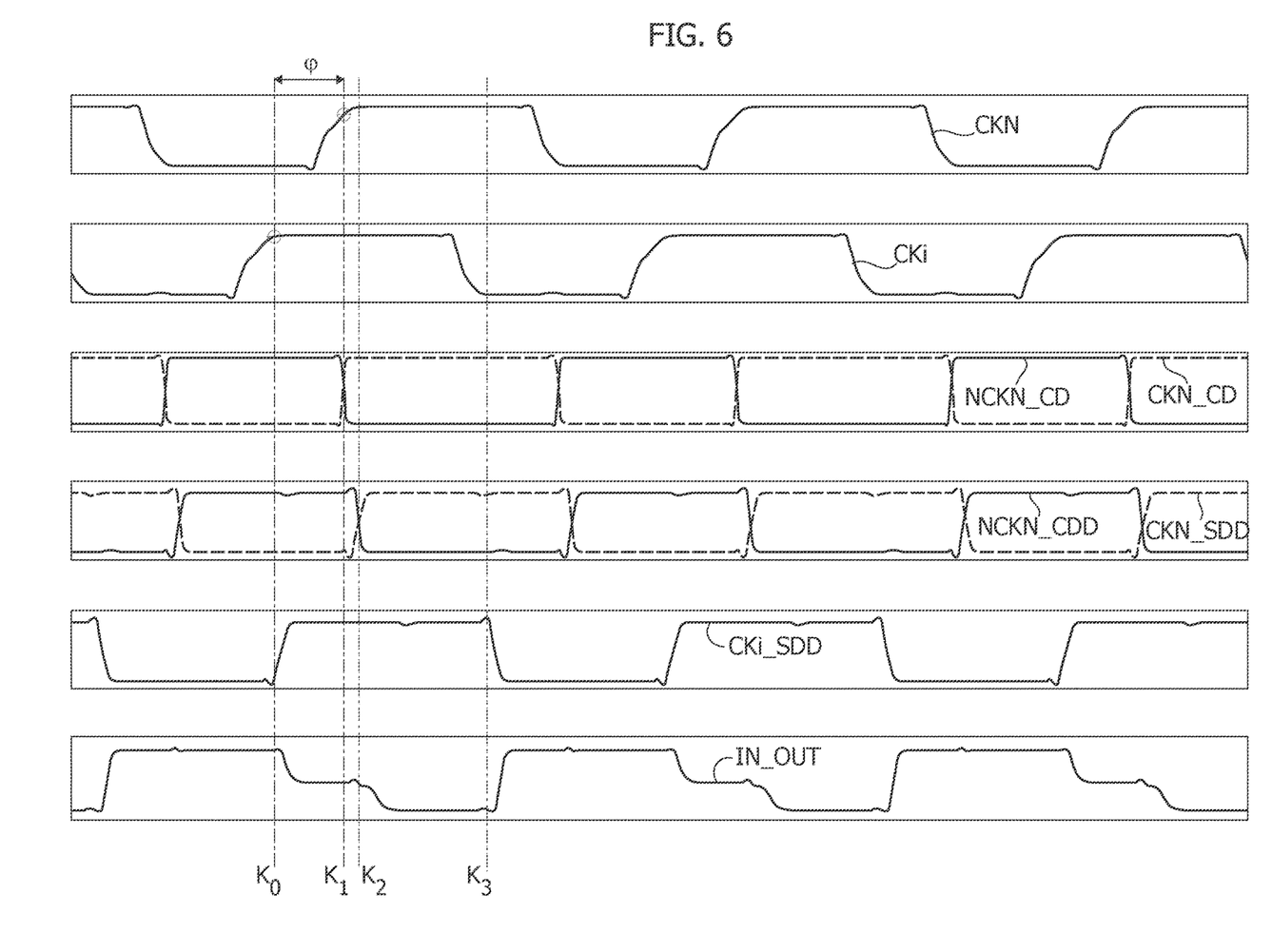
FIGS. 6 and 7 are time diagrams of exemplary signals in one or more embodiments as per the present disclosure.
Figure 7:
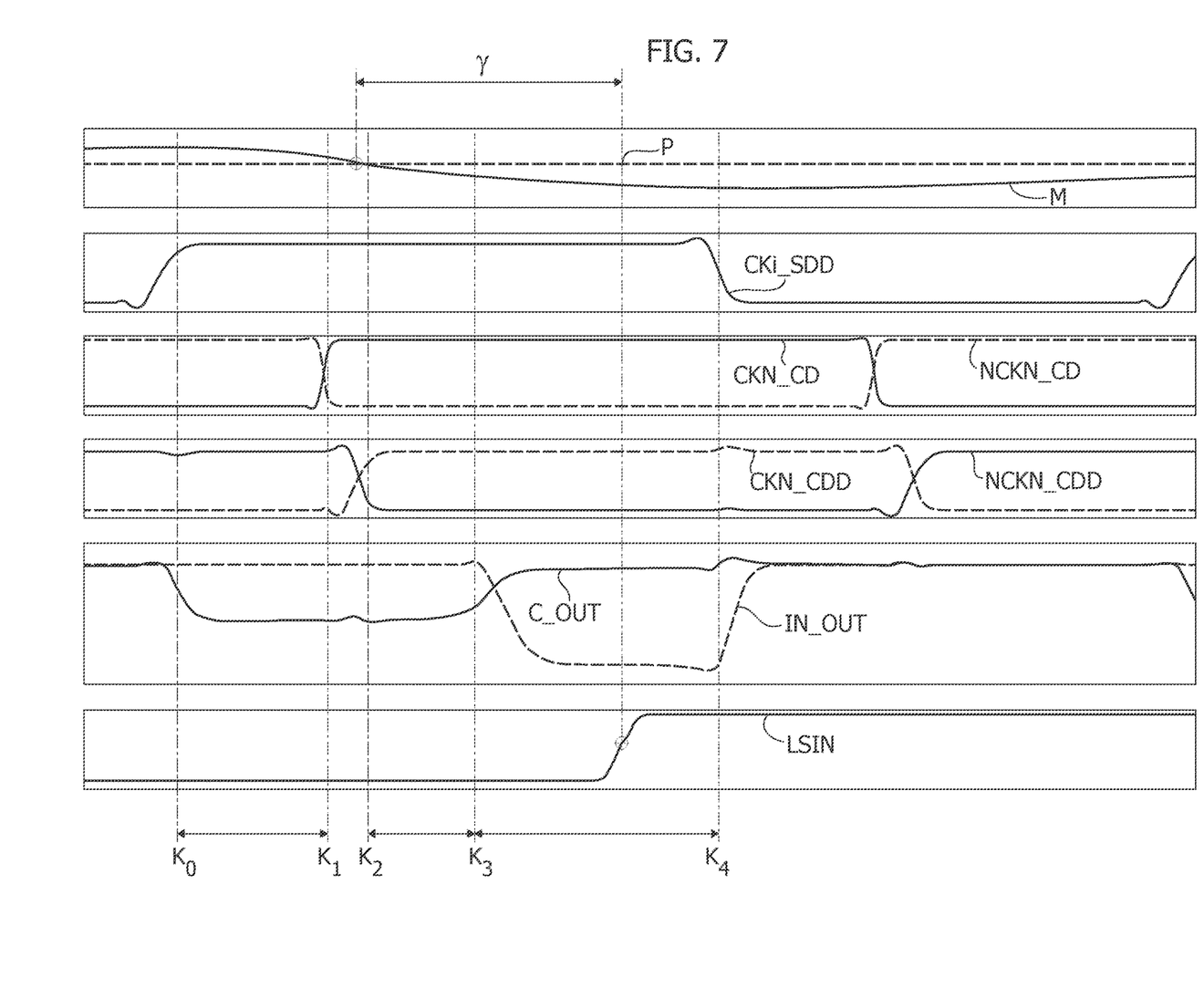

FIGS. 6 and 7 comprise diagrams exemplary of evolution over time of synchronization signals NCKN_CD, CKN_CD, CKN_SDD that may be produced via the third synchronization circuit 14N exemplified in FIG. 3 based on the third clock signal CKN.

Figure 4:
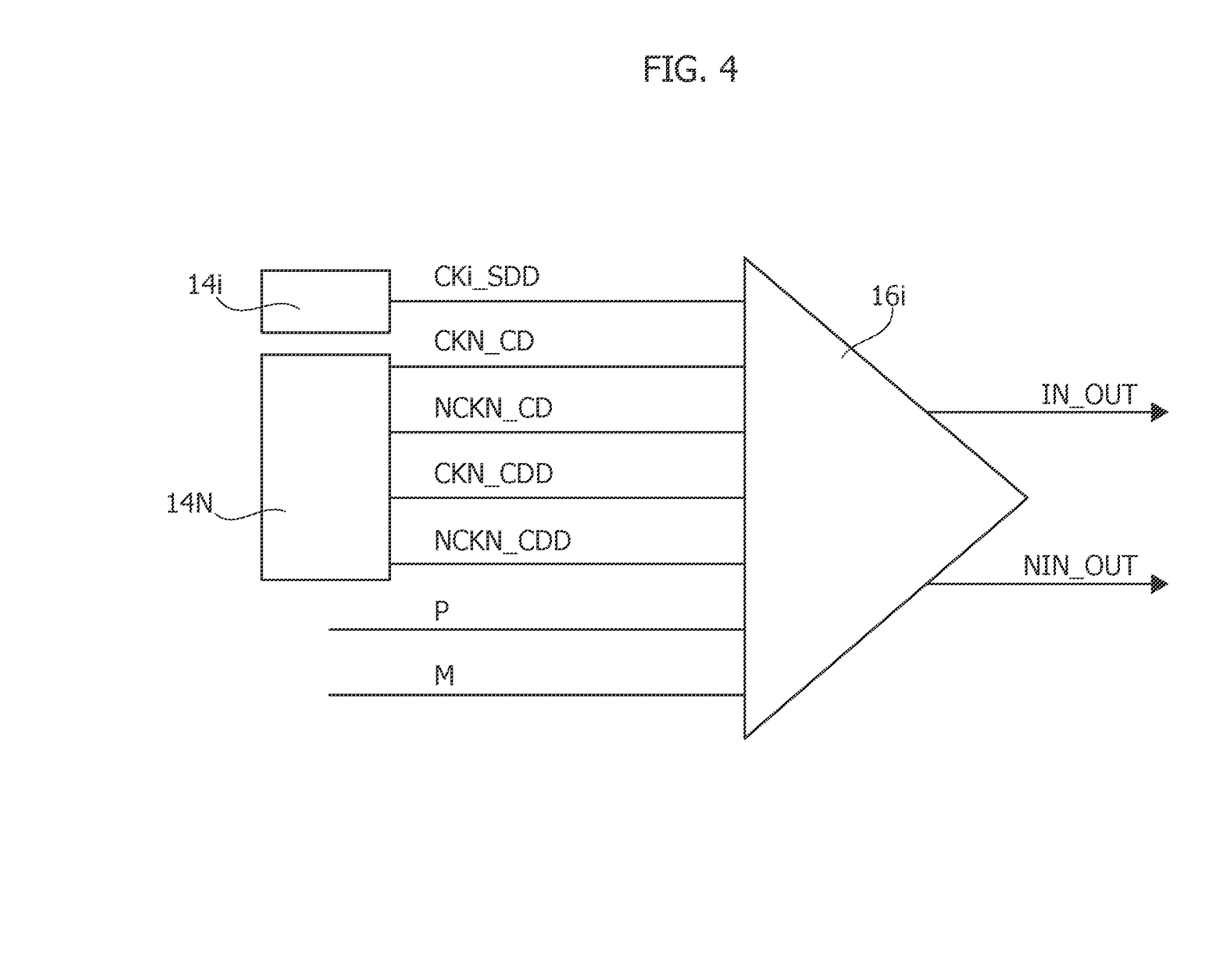

As exemplified in FIG. 4 and discussed in the foregoing, the third clock signal CKN is in a timed relationship with the second clock signal CKi as the third clock signal CKN is delayed by one propagation delay u with respect to the second clock signal CKi.

As exemplified in FIGS. 1 and 4, comparison circuits (e.g., 16i) in the plurality of comparator circuits 16A, 16i, 16N of the comparison circuitry 16 are configured to produce a i-th comparison signals (e.g., IN_OUT) based on respective synchronization signals (e.g., C_i) produced based on a (e.g., i-th) clock signal CKi that anticipates by one propagation delay the i-th clock signal CK_i and the (e.g., (i+1)-th) clock signal CKN that is delayed by one propagation delay u with respect to the i-th clock signal CK_i.

As exemplified in FIGS. 1 and 4, an i-th comparator circuit (e.g., the one referred to as 16i) in the comparator circuitry 16 is coupled to input nodes P, M to receive the comparison input signals. The comparator circuitry 16 is also coupled (i+1)-th synchronization circuit (e.g., third synchronization circuit 14N) to receive a first set of synchronization signals based on the (i+1)-th clock signal (e.g., the first synchronization signal NCKN_CD and the second synchronization signal CKN_CDD provided by the third synchronization circuit 14N based on the third clock signal CKN). The comparator circuitry 16 is also coupled to the i-th synchronization circuit (e.g., second synchronization circuit 14i) to receive a further synchronization signal (e.g., CKi_SDD) based on the i-th clock signal (e.g., the third synchronization signal CKi_SDD produced by the second synchronization circuit 14i based on the second clock signal CKi).

For instance, the further synchronization signal CKi_SDD (among other further synchronization signals CKi_CDD, NCKi_CDD, NCKi_SDD) for the second comparator circuit 16i may be produced by a respective synchronization circuit 14i, e.g., by replacing the third clock signal CKN exemplified in FIG. 3 with the second clock signal CKi.

Figure 5:
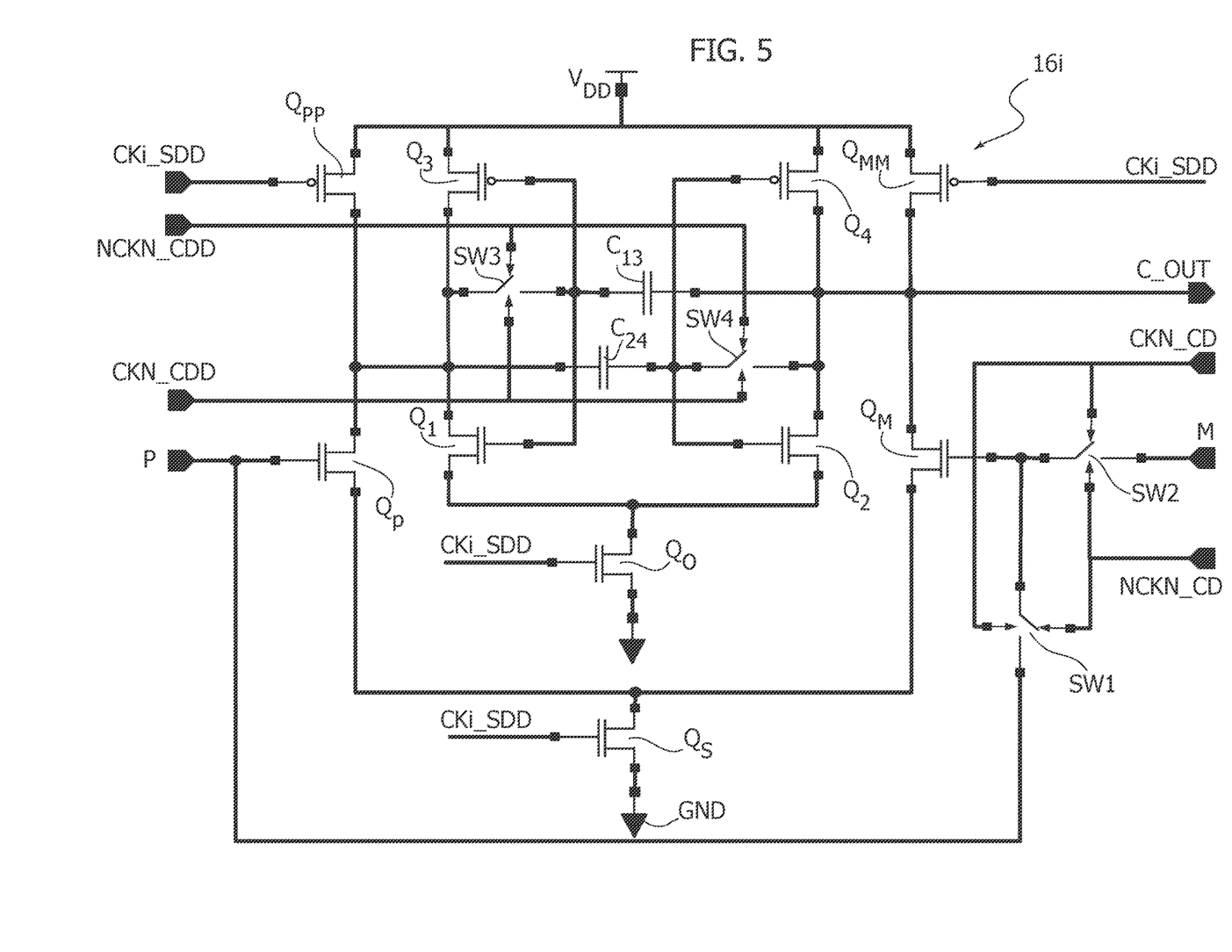
FIG. 5 is a diagram exemplary of a comparator circuit as per the present disclosure.

As exemplified in FIG. 5, optionally, the i-th comparator circuit (e.g., 16i) in the comparator circuitry 16 receives from the (i+1)-th synchronization circuit (e.g., the third 14N) also the complementary synchronization signals (e.g., CKN_CD, NCKN_CDD provided via the complementary second data path branch 319, 321).

As exemplified in FIG. 4, the i-th comparator circuit 16i is configured to provide an i-th comparator output signal (e.g., IN_OUT) indicative of the result of the comparison of input signals P, M. For instance, the i-th comparison output signal IN_OUT may have a first value (e.g., "1") when the first input signal P has a higher value than the second input signal M, and vice versa.

As exemplified in FIG. 4, optionally, also a complementary output signal NIN_OUT may be provided as the negated version of the output signal IN_OUT.

As exemplified in FIG. 5, the i-th comparator circuit (e.g., second comparator circuit 16i) in the comparator circuit 16 comprises a differential pair of transistors $Q_P$, $Q_M$ (e.g., n-channel MOSFET transistors) comprising a first differential transistor $Q_P$ having a control node configured to receive the first input signal P and a second differential transistor $Q_M$ having a respective control nodes configured to receive the second input signal M. The first $Q_P$ and second $Q_M$ differential transistors have a common (e.g., source) node coupled to ground via a common switch $Q_s$. The common switch is configured to be made conductive, resp. non-conductive, in response to the further synchronization signal (e.g., CKi_SDD) having a first (e.g., "o") value.

A first control switch SW1 is interposed between the control node of the first differential transistor $Q_P$ and the control node of the second differential transistor $Q_M$ and a second control switch SW2 interposed between the control node of the second differential transistor $Q_P$ and the second input node M. The first SW1 and second SW2 control switches are configured to be made conductive, resp. non-conductive, in response to the first synchronization signal NCKN_CD having a first value (e.g., "o"), resp. second value (e.g., "i"). Optionally, the first SW1 and second SW2 control switches are configured to be made conductive, resp. non-conductive, also or alternatively in response the first complementary synchronization signal CKN_CD having a first (e.g., "i"), resp. second (e.g., "o"), value.

A pair of switching transistors $Q_{PP}$, $Q_{MM}$ (e.g., n-channel MOSFET transistors) comprises a first transistor $Q_{PP}$ having a control node configured to receive the further synchronization signal (e.g., CKi_SDD) and configured to initialize the drains of transistors $Q_1$, $Q_3$ and $Q_P$ while the further synchronization signal CKi_SDD has a first (e.g., low) value, for instance by providing a current flow line between the first differential transistor $Q_P$ and a supply voltage VDD in response to the further synchronization signal (e.g., CKi_SDD) having the first value (e.g., "o"). A second transistor $Q_{MM}$ has a control node configured to receive the further synchronization signal (e.g., CKi_SDD) and to initialize the drains of transistors $Q_2$, $Q_4$ and $Q_M$ during the phase in which the further synchronization signal CKi_SDD is "low", for instance by providing a current flow line between the second differential transistor $Q_M$ and a supply voltage VDD in response to the further synchronization signal (e.g., CKi_SDD) having the first value (e.g., "o").

As exemplified in FIG. 5, the i-th comparator 16i further comprises a latch "core" arrangement comprising a quadruplet of transistors $Q_1$, $Q_2$, $Q_3$, $Q_4$. For instance, the i-th comparator 16i includes a first $Q_1$ and a third $Q_3$ quadruplet transistor having respective control nodes coupled (e.g., directly) therebetween and a second $Q_2$ and a fourth $Q_4$ quadruplet transistor having respective control nodes coupled (e.g., directly) therebetween. The first $Q_1$ and the second $Q_2$ transistors have a common (e.g., source) node coupled to ground via a further common switch $Q_s$, while the third $Q_3$ and fourth $Q_4$ transistors have a common (e.g., drain) node coupled to the supply voltage VDD.

As exemplified in FIG. 5, the core arrangement further comprises a set of capacitors $C_{13}$, $C_{24}$ and a set of switches SW3, SW4 configured to compensate mismatches among these capacitors $C_{13}$, $C_{24}$.

For instance, the set of capacitors $C_{13}$, $C_{24}$ comprises a first capacitor $C_{13}$ and a second capacitor $C_{24}$. The first capacitor $C_{13}$ has a first capacitor end coupled (e.g., directly) to the common control node of the first $Q_1$ and third $Q_3$ quadruplet transistor and a second capacitor end intermediate the second $Q_2$ and fourth $Q_4$ quadruplet transistors as well as coupled to a communication node C_OUT intermediate the second differential transistor $Q_M$ and the second transistor $Q_{MM}$. The second capacitor $C_{24}$ having a respective first capacitor end intermediate the first $Q_1$ and third $Q_3$ quadruplet transistors as well as intermediate the current flow path of the first differential transistor $Q_P$ and the first transistor $Q_{PP}$ and a respective second capacitor end coupled (e.g., directly) to the common control node of the second $Q_2$ and fourth $Q_4$ quadruplet transistors.

For instance, the set of compensating switches SW3, SW4 comprises a third control switch SW3 coupled to the first capacitor end of the first capacitor $C_{13}$ and to a node intermediate the first $Q_1$ and third $Q_3$ quadruplet transistors, as well as a fourth control switch SW4 coupled to the respective second capacitor end of the second capacitor $C_{24}$ and to a node intermediate the current flow path through the second $Q_2$ and fourth $Q_4$ quadruplet transistors. The third SW3 and fourth SW4 control switches are configured to be made conductive, resp. non-conductive, in response to the second (pair of complementary) synchronization signal(s) (e.g., CKN_CDD/NCKN_CDD) having a first (e.g., "0"/ "1") value; optionally, the first SW1 and second SW2 control switches are configured to be made conductive, resp. non-conductive, also or alternatively in response the second complementary couple of synchronization signal NCKN_CD/CKN_CD having a first (e.g., "1"/"0"), resp. second (e.g., "0"/"1"), value.

As exemplified in FIGS. 6 and 7, the set of i-th synchronization signals C_i drives switches SW1, SW2, SW3, SW4 in the comparator circuit 16i so that a set of operating phases taking place sequentially in a series of time intervals K0-K1, K2-K3, K3-K4 can be identified in operating the comparator circuit 16i.

For instance, the set of operating phases comprises a first operating phase that takes place in a first time interval K0-K1 (referred to as offset-compensation phase), a second operating phase that takes place in a second time interval K2-K3 (referred to as switching phase), and a third operating phase that takes place in a third time interval K3-K4 (referred to as output windowing phase). Each of these phases are discussed in the following.

As exemplified in FIG. 7, as an example, the first operating phase K0-K1 starts at time instant K0 when the first SW1 switch is made conductive and second SW2 switch is made non-conductive, so that the input nodes P, of the first differential pair $Q_P$, and the gate of transistor $Q_M$ are shorted. Still in this phase, the set of offset compensating switches SW3, SW4 is made conductive to perform equalization of the capacitors $C_{13}$, $C_{24}$ in the "core" section of the comparator circuit 16i, reducing mismatches and increasing accuracy thereof. In this first phase, the equalization ends at time interval K1 by making non-conductive SW1 and conductive SW2, while the third SW3 and fourth SW4 control switches are made non-conductive just after, at subsequent time interval K2.

As exemplified in FIGS. 6 and 7, after the offset compensating phase K0-K1, the second operating phase (referred to as switching phase) K2-K3 starts at time instant K2 when the first differential pair of transistors $Q_P$, $Q_M$ receives the input signals P, M and performs comparison thereof, producing a i-th comparison signal C_OUT at the communication node C_OUT, for instance, for a difference between input signals P, M of about less than 10 mV. The switching phase may last about 314 ps.

As exemplified in FIGS. 6 and 7, during the third operating phase in time interval K3-K4, the multiplexer 18 receives the communication signal from the communication node C_OUT of the i-th comparator 16i and enables its output for an allotted time (referred to as output window) so that the i-th communication signal is output after the (i−1)-th communication signal (e.g., A_OUT) produced by the (i−1)-th comparator (e.g., 16A) and before the (i+1)-th communication signal (e.g., N_OUT) produced by the (i+1)-th comparator (e.g., 16N).

Figure 8:
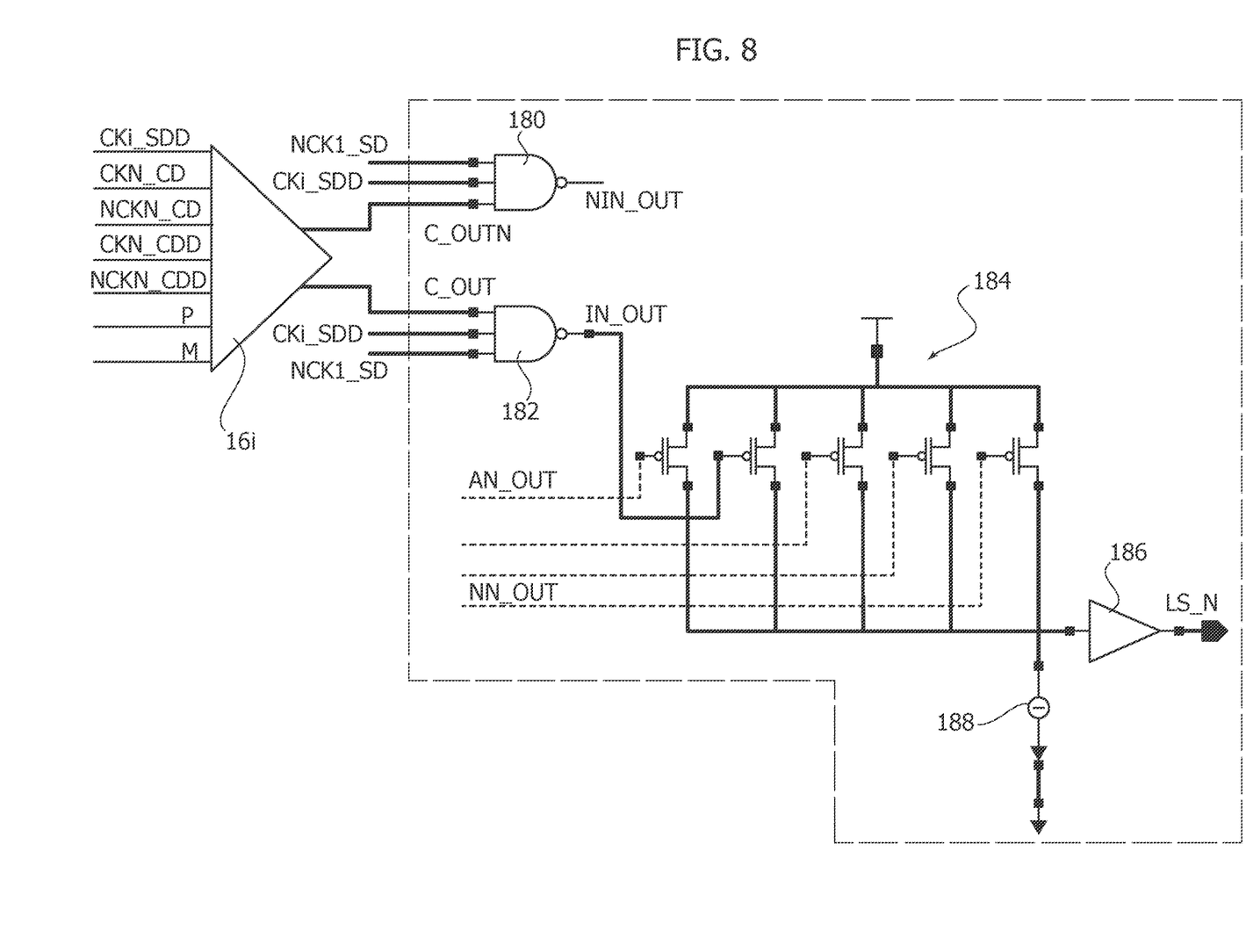
FIG. 8 is a diagram exemplary of a portion of the system exemplified in FIG. 1.

As exemplified in FIGS. 7 and 8, an i-th output window becomes open after the i-th comparator 16i performs the second, switching operating phase K2-K3. For instance, the multiplexer 18 controls output window opening by applying a NAND logical processing 18o, 182 to the further synchronization signal (e.g., CKi_SDD) based on the i-th clock signal (e.g., the third synchronization signal CKi_SDD provided by the second synchronization circuit 14i based on the second clock signal CKi) and an (i−1)-th clock signal (e.g., a synchronization signal NCK1_SD provided by the first synchronization circuit 141 based on the first clock signal CKi).

An example of a method as exemplified herein comprises the following steps. A set of clock signals CKi, CKi, CKN is produced having a same clock period TRO. Clock signals in the set of clock signals have a mutual time delay σ between respective clock signal edges. The plurality of comparator circuits 16 receive the first input signal P and the second input signal M to perform comparison thereof. Comparator circuits 16A, 16i, 16N in the plurality of comparator circuits produce a set of comparison signals AN_OUT, IN_OUT, NN_OUT as a result of a respective sequence of comparison phases K0, K1, K2, K3, K4. The comparison signals AN_OUT, IN_OUT, NN_OUT have a first value in response to the second input signal reaching the first input signal and a second value in response to the second input signal failing to reach the first input signal.

Comparator circuits in the plurality of comparator circuits are driven to perform respective sequences of comparison phases in a timed relationship therebetween based on clock signals in the set of clock signals CK1, CKi, CKN and allotted to each one of the comparator circuits 16A, 16i, 16N in the plurality of comparator circuits respective time windows K3, K4, Δ' for communication of the comparison signals AN_OUT, IN_OUT, NN_OUT over respective communication lines for the respective allotted time windows. The respective time windows are synchronized based on the clock signals in the set of clock signals.

Respective communication lines of the comparator circuits in the plurality of comparator circuits are coupled to an output line OUT; LSIN and sequentially enable each one of the comparator circuits in the plurality of comparator circuits to output respective comparison signals over the output line. Respective comparison signals sequentially output over the output line form a composite comparison signal LSIN evolving over time.

As exemplified herein, the respective sequence of comparison phases in which comparator circuits 16A, 16i, 16N in the plurality of comparator circuits 16 are configured to produce the set of comparison signals AN_OUT, IN_OUT, NN_OUT comprises sequentially enabling 183 each one of the comparator circuits in the plurality of comparator circuits to output respective comparison signals over the output line OUT, LSIN for the respective allotted time windows K3, K4; Δ'. For instance, the output comparison signals partially overlap over time.

As exemplified in FIG. 8, the multiplexer 18 comprises a set of switching transistors 184 having control nodes configured to receive the i-th comparison signal IN_OUT and to propagate it to an output line LSIN (e.g., after amplification via a buffer 186) that is allotted a respective time length so that it is intermediate (e.g., juxtaposed between) the (i−1)-th comparison signal AN_OUT and the (i+1)-th comparison signal NN_OUT.

Figure 9:
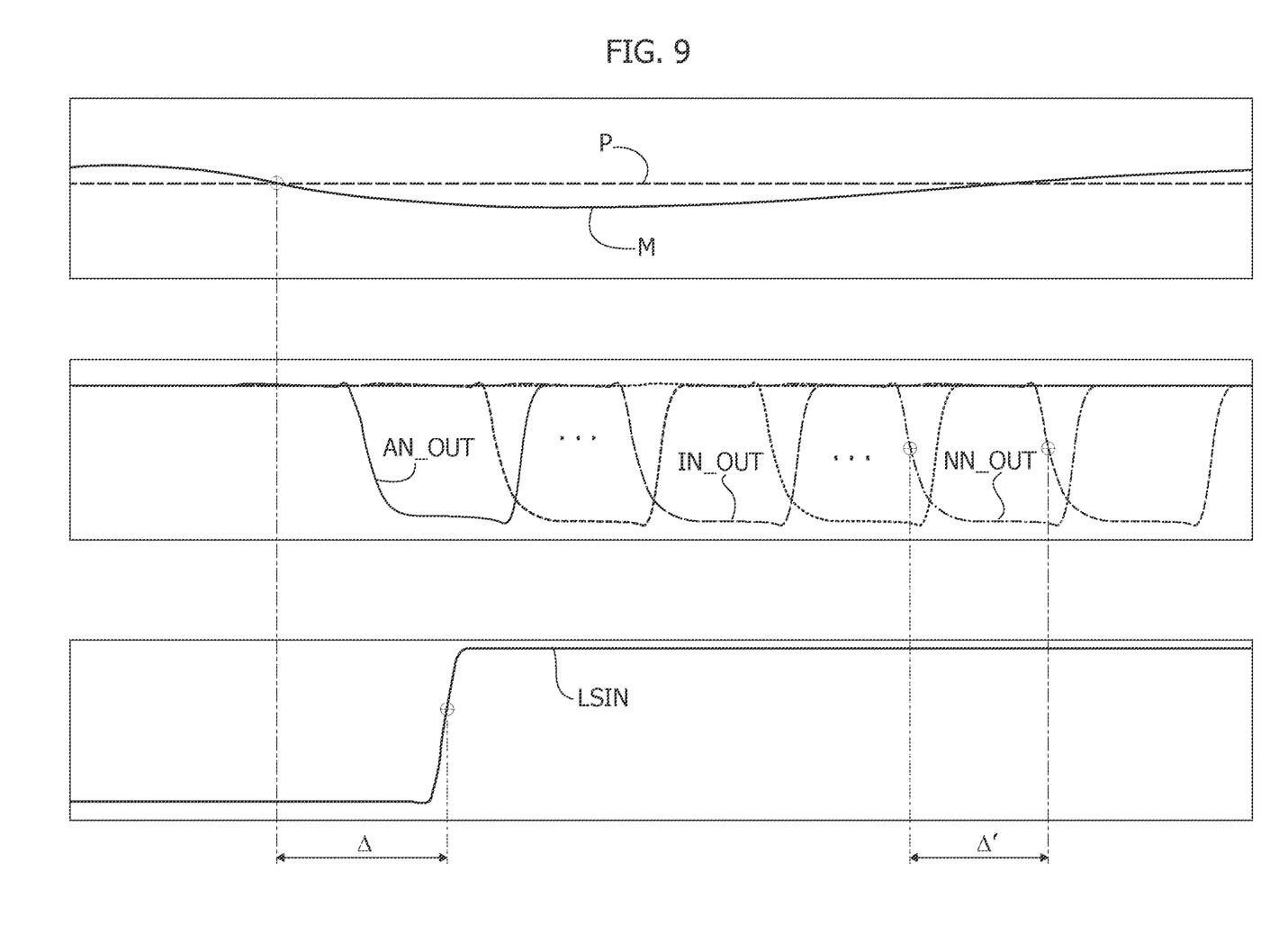
FIG. 9 is a time diagram of exemplary signals produced in operating the comparator circuit exemplified in FIG. 8.

As exemplified in FIG. 9, a window size of the opening window for an i-th comparison signal C_OUT may have a time length Δ'.

As exemplified in FIGS. 8 and 9, the method of operating a plurality of dynamic converters 161, 16i, 16N as exemplified herein provides comparison results in a short time (e.g., with output window size A about hundreds of picoseconds) in continuous manner on an output line LSIN, OUT, the i-th output window A partially overlapping the adjacent ones Δ'.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A system, comprising:
a ring oscillator configured to produce a set of clock signals having the same clock period, wherein clock signals in the set of clock signals have a mutual time delay between respective clock signal edges;
a first input node configured to receive a first input signal;
a second input node configured to receive a second input signal;
a plurality of comparator circuits coupled to the first and second input nodes, each of the plurality of comparator circuits comprises a plurality of switches so that different comparator circuits of the plurality of comparator circuits simultaneously perform a first operation phase, a second operation phase, and a third operation phase, wherein each of the plurality of comparator circuits is configured to perform a comparison over a sequence of operation phases comprising the first operation phase to perform offset compensation, the second operation phase to compare the first input signal and the second input signal and to produce a comparison signal as a result of comparing the first and second input signals, and the third operation phase to communicate the comparison signal over a respective communication line, and wherein the comparison signals have a first value in response to the second input signal reaching the first input signal and a second value in response to the second input signal failing to reach the first input signal; and
a set of synchronization circuits coupled to an output of the ring oscillator and to inputs of each of the plurality of comparator circuits, the set of synchronization circuits configured to drive the plurality of switches of the different comparator circuits to simultaneously perform the first operation phase, the second operation phase, and the third operation phase in a timed relationship based on the clock signals, wherein the set of synchronization circuits is configured to allot, to each one of the comparator circuits, a respective time window for communication over the respective communication line for each of the comparison signals, the respective time windows being synchronized based on the clock signals; and
a multiplexer coupled to outputs of the comparator circuits and an output of the set of synchronization circuits, the multiplexer configured to couple the respective communication lines of the comparator circuits to an output line and to sequentially enable each one of the comparator circuits to sequentially output respective comparison signals over the output line for the respective time windows, wherein respective comparison signals sequentially output over the output line form a composite comparison signal evolving over time.

2. The system of claim 1, wherein the comparator circuits are configured to be sequentially enabled to output respective comparison signals over the output line for the respective time windows.

3. The system of claim 2, wherein the output comparison signals partially overlap over time.

4. The system of claim 1, wherein:
the ring oscillator is configured to produce N of clock signals, N being a real number;
the plurality of comparator circuits comprises N comparator circuits; and
the mutual time delay between the clock signals is equal to a fraction 1/N of the clock period of the clock signals.

5. The system of claim 4, wherein the comparator circuits are configured to be sequentially enabled to output respective comparison signals over the output line for the respective time windows.

6. The system of claim 5, wherein the output comparison signals partially overlap over time.

7. The system of claim 1, wherein the clock signals partially overlap over time.

8. A method, comprising:
producing a set of clock signals having a same clock period, wherein clock signals in the set of clock signals have a mutual time delay between respective clock signal edges;
producing sets of synchronization signals based on the set of clock signals;
performing offset compensation for a first comparison of a first input signal and a second input signal based on a first set of synchronization signals;
comparing the first input signal and the second input signal to produce a first comparison signal while performing offset compensation for a second comparison of the first input signal and the second input signal based on a second set of synchronization signals;

communicating the first comparison signal over a first communication line during a first time window while comparing the first input signal and the second input signal to produce a second comparison signal and performing offset compensation for a third comparison of the first input signal and the second input signal based on a third set of synchronization signals;

communicating the second comparison signal over a second communication line during a second time window while comparing the first input signal and the second input signal to produce a third comparison signal;

communicating the third comparison signal over a third communication line during a third time window; and sequentially outputting the first, second, and third comparison signals over an output line during the first, second, and third time windows to form a composite comparison signal evolving over time.

9. The method of claim 8, wherein:
the set of clock signals comprises N of clock signals, N being a real number;
the comparing is performed by N comparator circuits; and
the mutual time delay between clock signal edges of the clock signals is a fraction 1/N of a clock period of the clock signals.

10. The method of claim 9, wherein sequentially outputting the first, second, and third comparison signals comprises sequentially enabling each one of the comparator circuits to output the first, second, and third comparison signals over the output line for the respective first, second, and third time windows.

11. The method of claim 10, wherein the output comparison signals partially overlap over time.

12. A method, comprising:
producing a set of clock signals having the same clock period, wherein clock signals in the set of clock signals have a mutual time delay between respective clock signal edges;
providing a first input signal and a second input signal to a plurality of comparator circuits to perform a comparison over a sequence of operation phases comprising a first operation phase, a second operation phase, and a third operation phase, wherein different comparator circuits of the plurality of comparator circuits simultaneously perform the first operation phase, the second operation phase, and the third operation phase;
performing offset compensation by each of the comparator circuits during the first operation phase;
comparing the first input signal and the second input signal to produce a comparison signal by each of the comparator circuits during the second operation phase, wherein the comparison signals have a first value in response to the second input signal reaching the first input signal and a second value in response to the second input signal failing to reach the first input signal;
communicating the comparison signal over a respective communication line by each of the comparator circuits during the third operation phase;
allotting, to each of the comparator circuits, a respective time window for the communication of the comparison signal over the respective communication line for the respective time window, wherein the respective time windows are synchronized based on the clock signals; and coupling the respective communication lines of the comparator circuits in the plurality of comparator circuits to an output line.

13. The method of claim 12, wherein the respective communication lines are coupled to the output line using a multiplexer.

14. The method of claim 12, wherein the comparator circuits are driven by a synchronization circuit that receives the clock signals.

15. The method of claim 14, wherein the respective communication lines are coupled to the output line using a multiplexer having a selection input coupled to the synchronization circuit.

16. The method of claim 12, wherein the comparison signals are produced by sequentially enabling each of the comparator circuits to output the respective comparison signals over the output line for the respective time windows and wherein the respective comparison signals sequentially output over the output line form a composite comparison signal evolving over time.

17. The method of claim 16, wherein the output comparison signals partially overlap.

18. The method of claim 12, wherein:
the set of clock signals comprises N clock signals, N being a real number;
the plurality of comparator circuits comprises N comparator circuits; and
the mutual time delay between clock signal edges of clock signals is a fraction 1/N of the clock period.

19. The method of claim 18, wherein the comparison signals are produced by sequentially enabling each of the comparator circuits to output respective comparison signals over the output line for the respective time windows.

20. The method of claim 19, wherein the output comparison signals partially overlap.

21. The system of claim 1, further comprising a microcontroller coupled to the output line of the multiplexer.

22. The system of claim 1, wherein the system is part of an electronic device, the electronic device being one of a charge pump regulator, a sensor, or a low dropout regulator.

23. A system comprising:
a ring oscillator;
a set of synchronization circuits comprising a first synchronization circuit coupled to the ring oscillator to receive a first clock signal, a second synchronization circuit coupled to the ring oscillator to receive a second clock signal, and a third synchronization circuit coupled to the ring oscillator to receive a third clock signal;
a first comparator circuit coupled to a first input node, a second input node, an output of the first synchronization circuit, and an output of the second synchronization circuit, the first comparator circuit configured to output a first comparison signal;
a second comparator circuit coupled to the first input node, the second input node, the output of the second synchronization circuit, and an output of the third synchronization circuit, the second comparator circuit configured to compare the first input node and the second input node while the first comparator circuit outputs the first comparison signal;
a third comparator circuit coupled to the first input node, the second input node, the output of the first synchronization circuit, and the output of the third synchronization circuit, the third comparator circuit configured to perform offset compensation while the second comparator circuit compares the first input node and the second input node; and a multiplexer coupled to an output of the first comparator circuit, an output of the second comparator circuit, an output of the third comparator circuit, and an output of the set of synchronization circuits, wherein the multiplexer outputs a composite comparison signal based on a sequential output from the first comparator circuit, the second comparator circuit, and the third comparator circuit.

* * * * *